United States Patent [19]
Saito

[11] Patent Number: 5,386,197
[45] Date of Patent: Jan. 31, 1995

[54] SLIDABLE ADAPTER FOR SIMULTANEOUS CONNECTION OF A PLURALITY OF CONTACTS OF A BACKBOARD TEST MODULE TO CONDUCTORS OF A BACKBOARD

[75] Inventor: Koichi Saito, Yamanashi, Japan

[73] Assignee: NEC Corporation, Tokyo, Japan

[21] Appl. No.: 35,695

[22] Filed: Mar. 23, 1993

[30] Foreign Application Priority Data

Mar. 24, 1992 [JP] Japan .................. 4-065605

[51] Int. Cl.6 ............................ G01R 15/12
[52] U.S. Cl. .................... 324/757; 324/758
[58] Field of Search ......... 324/158 F, 158 P, 72.5, 324/752, 761, 758; 439/482, 60, 68, 70

[56] References Cited

U.S. PATENT DOCUMENTS

| | | |
|---|---|---|
| 4,417,204 | 11/1983 | Dehmel et al. ............ 324/158 F |
| 4,516,072 | 5/1985 | Marpoe, Jr. ............... 324/158 F |
| 4,540,229 | 9/1985 | Madden ..................... 324/158 F |
| 4,724,377 | 2/1988 | Maelzer et al. ............ 324/158 F |
| 4,963,822 | 10/1990 | Prokopp ..................... 324/758 |

Primary Examiner—Vinh Nguyen
Attorney, Agent, or Firm—Sughrue, Mion, Zinn, Macpeak & Seas

[57] ABSTRACT

A test adapter includes a plurality of contact pins, a test module, a plurality of conductive pins, and a connector member. Each of the plurality of contact pins has a contact portion at one end thereof and is driven in a printed board. The test module has a test circuit for testing whether a backboard having the printed board is nondefective. The plurality of conductive pins project from the test module at positions corresponding to the contact pins and electrically connected to the test module. The connector member simultaneously brings the conductive pins into contact with the contact portions of the contact pins, respectively.

7 Claims, 2 Drawing Sheets

SLIDABLE ADAPTER FOR SIMULTANEOUS CONNECTION OF A PLURALITY OF CONTACTS OF A BACKBOARD TEST MODULE TO CONDUCTORS OF A BACKBOARD

BACKGROUND OF THE INVENTION

The present invention relates to a test adapter and, more particularly, to a test adapter used for testing the presence/absence of disconnection and short-circuiting of a pattern, connection failures of connectors, erroneous wiring, and the like in the pattern of a backboard consisting of a printed board, various connectors, mechanical components, wiring between connector pins, and the like.

A conventional test adapter has a structure in which contact pins connected to an object to be tested and a module having a test circuit stored in a predetermined housing constituting a main body apparatus are connected to each other through a large number of cables. In this conventional test adapter, since the contact pins are connected to the module of the main body by the large number of cables, the size of the test apparatus is increased, and the weight of a test adapter unit is considerably increased. For this reason, the connection operability of the test adapter is degraded, and an operation time is increased. In addition, since the contact pins are manually, independently connected to the module, the connectors of the backboard may be broken.

SUMMARY OF THE INVENTION

It is an object of the present invention to provide a test adapter capable of testing a backboard by improving the operability of a test for the backboard.

It is another object of the present invention to provide a test adapter capable of preventing damage to connectors of a printed board in a test for a backboard.

In order to achieve the above objects, according to the present invention, there is provided a test adapter comprising a plurality of contact pins each having a contact portion at one end thereof and driven in a printed board, a test module having a test circuit for testing whether a backboard having the printed board is nondefective, a plurality of conductive pins projecting from the test module at positions corresponding to the contact pins and electrically connected to the test module, and connector means for simultaneously bringing the conductive pins into contact with the contact portions of the contact pins, respectively.

DESCRIPTION OF THE PREFERRED EMBODIMENT

Figure 1:
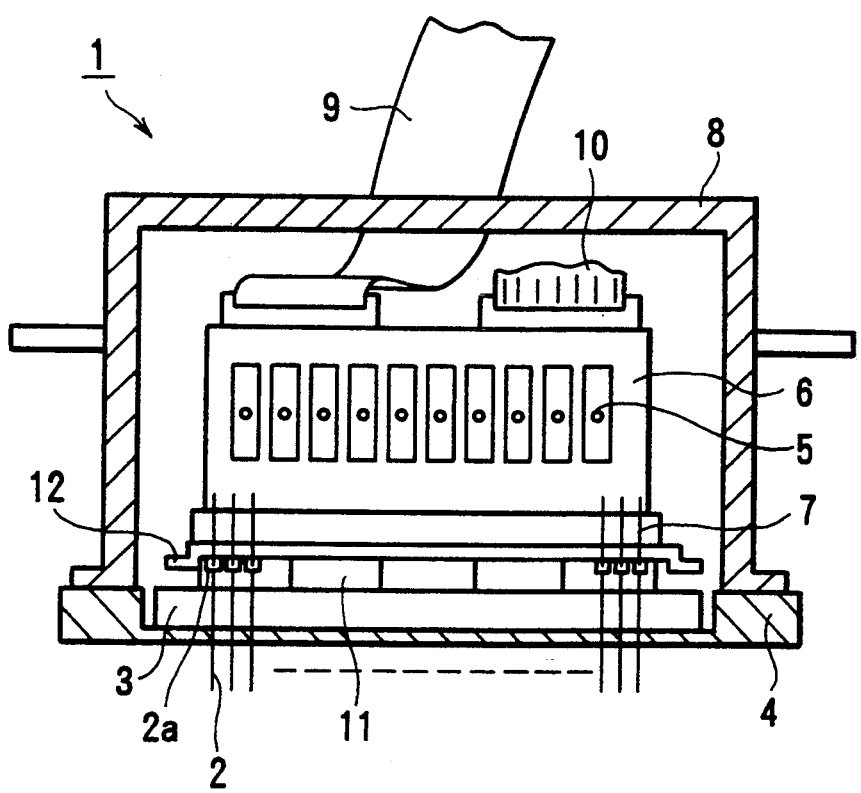
FIG. 1 is a sectional view showing a test adapter according to an embodiment of the present invention.
Figure 2:
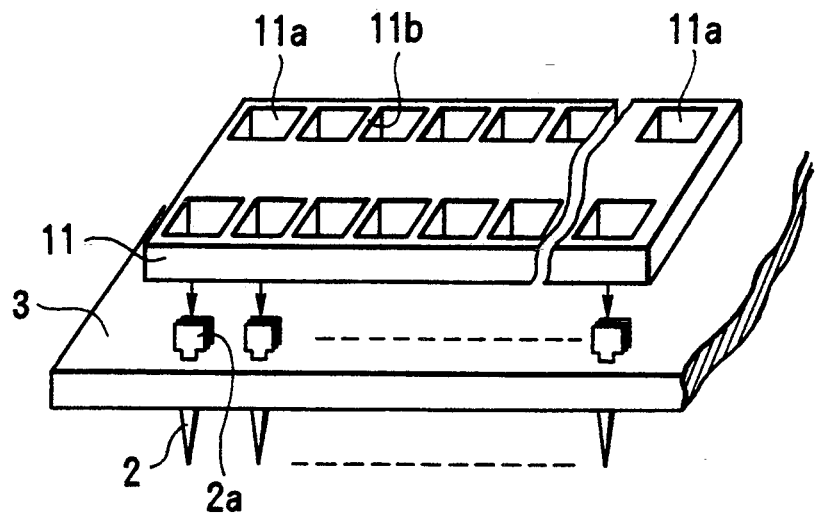
FIG. 2 is a perspective view showing a housing 11 in FIG. 1.
Figure 3:
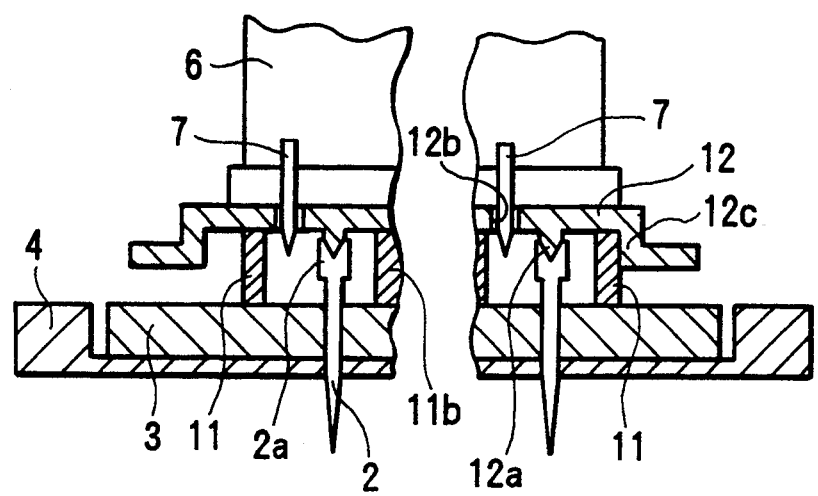
FIG. 3 is a sectional view showing contact pins 2, a slidable cover 12, and the like in FIG. 1.

FIG. 1 shows a test adapter according to an embodiment of the present invention, FIG. 2 shows a housing 11 shown in FIG. 1, and FIG. 3 shows the main part of a portion of contact pins 2 and a slidable cover 12 shown in FIG. 1. In FIGS. 1 to 3, reference numeral 1 denotes a test adapter connected through control cable 9 to a main body apparatus (not shown) having a display unit and the like; plurality of contact pins for testing a backboard (not shown). The test adapter includes each having a contact portion 2a constituted by a contact structure obtained by stacking a plurality of leaf springs; a printed board, 3 in which the contact pins 2 are inserted; a flange 4 for placing, positioning, and fixing the printed board 3; a test module 6 on which a plurality of LSIs 5 having a test circuit are mounted; a plurality of conductive pins 7 projecting from the lower portion of the test module 6; a case 8 for covering the test module 6; a chain cable 10 for connecting the LSIs 5 of the test module 6 to each other; a honeycombed housing 11 having a large number of quadrangular storing holes 11a arranged in correspondence with the conductive pins 7 as shown in FIG. 2; and a slidable cover 12 which has a large number of projections 12a formed on the lower surface of the slidable cover 12 in correspondence with the conductive pins 7, pin holes 12b formed on the same slide line as that of the projections 12a, and a step portion 12c-formed around the slidable cover 12 and which is mounted on the upper surface of the housing 11 slidably in one predetermined linear direction. The multilayered contact structure of the contact portion of each of the contact pins 2 is obtained by stacking a plurality of leaf springs perpendicularly to the slide direction of the slidable cover 12. The projections 12a and the distal ends of the conductive pins 7 can be inserted in the contact portions of the contact pins 2 by a sliding operation. Note that the LSIs 5 having the test circuit, the conductive pins 7, the control cable 9, and the chain cable 10 which are mounted on the test module 6 are electrically connected to each other with printed wiring and wiring (neither are shown). In addition, the contact pins 2 and the conductive pins 7 are simply shown in FIG. 1.

Connection of the test module 6 to the contact pins 2 will be described below. The printed board 3 in which the plurality of contact pins 2 inserted is are positioned and fixed to the flange 4. The housing 11 in which the contact pins 2 are respectively stored in the storing holes 11a is placed on the positioned and fixed printed board 3 as shown in FIG. 2. The housing 11 prevents positional shifting of the contact portions 2a caused by bending the contact pins 2. In addition, as shown in FIG. 3, the slidable cover 12 is positioned such that the projections 12a are inserted in the contact portions 2a of the contact pins 2, and the slidable cover 12 covers the upper portion of the housing 11. The test module 6 is placed on the slidable cover 12 such that the conductive pins 7 arranged in correspondence with the pin holes 12b of the slidable cover 12 extend through the slidable cover 12. Finally, the control cable 9 and the chain cable 10 are connected to the test module 6, and the case 8 is mounted on the flange 4 to cover the test module 6.

Figure 4:
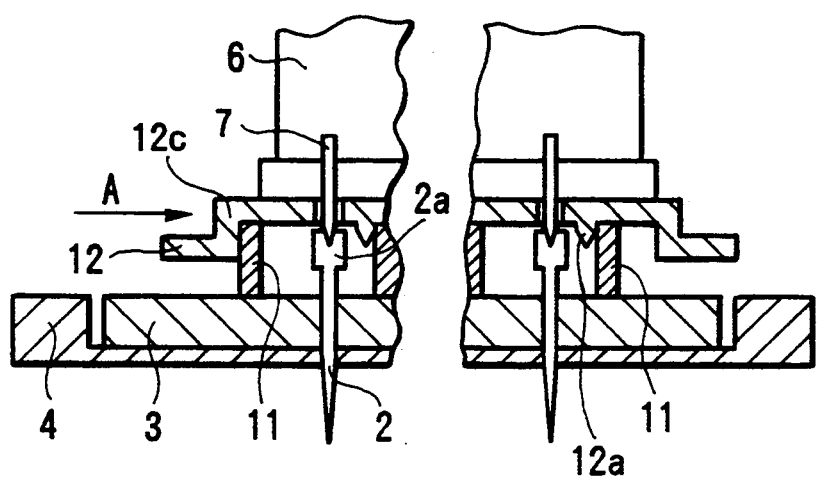
FIG. 4 is a sectional view showing the contact pins 2, the slidable cover 12, and the like in FIG. 1, in which pins 7 are brought into contact with the contact pins 2, respectively.

That is, as shown in FIG. 3, when the slidable cover 12 is moved to a nonconductive position on the left side in FIG. 3 such that one edge of the step portion 12c of the slidable cover 12 is brought into contact with one side surface of the housing 11, the projections 12a of the slidable cover 12 are inserted in the contact portions 2a of the contact pins 2, and the contact portions 2a are not in contact with the conductive pins 7. For this reason, the test module 6 and the contact pins 2 driven in the printed board 3 are set in a nonconductive state. As shown in FIG. 4, when the slidable cover 12 is moved in the direction of arrow A in FIG. 4, the projections 12a are removed from the contact portions 2a of the contact pins 2. In addition, when the slidable cover 12 is moved to a conductive position at which the other edge of the step portion 12c is brought into contact with the other side surface of the housing 11, the distal ends of the conductive pins 7 arranged on the same slide line as that of the projections 12a are brought into contact with the contact portions 2a of the contact pins 2. At this time, the projections 12a of the slidable cover 12 are brought into contact with walls 11b for partitioning the storing holes 11a. In this manner, the contact pins 2 for testing the backboard are simultaneously, directly connected to the test module 6, and a test for the backboard is started on the basis of the control of the control cable 9.

Note that the projections 12a of the slidable cover 12 are brought into contact with the contact portions 2a to perform the click operation of the slidable cover 12. In addition, the contact portions 2a of the plurality of contact pins 2 may be stored in the storing holes 11a of the housing 11. In this case, the plurality of conductive pins 7, and the plurality of projections 12a and pin holes 12b formed on and in the slidable cover 12 are arranged in correspondence with the contact pins 2.

As described above, according to the present invention, a test module on which an LSI having a test circuit is mounted is directly connected to the contact pins of a test adapter, and the test module is incorporated in the case of the test adapter. For this reason, the test adapter can be connected to an external circuit by only one control cable, and the size of a test apparatus and the weight of the test adapter can be decreased. Therefore, the connection operability of the test adapter is considerably improved, an operation time can be shortened, and a damage rate of backboard connectors can be reduced.

What is claimed is:
1. A test adapter comprising:
   a plurality of contact pins for connection to a backboard, said contact pins having contact portions at one end thereof;
   a support board for supporting said contact pins;
   a test module having a test circuit for testing the backboard;
   a plurality of conductive pins for electrical connection to said test Circuit, said conductive pins projecting from said test module at positions corresponding to said contact pins; and
   sliding means for moving said test module in parallel to a surface of said support board to simultaneously bring said conductive pins into contact with said contact portions of said contact pins.
2. A test adapter according to claim 1, further comprising a honeycombed housing arranged on said support board and having an upper surface and a plurality of storing holes for respectively storing said contact portions of said contact pins.
3. A test adapter according to claim 2, wherein said sliding means is slidable in a predetermined linear direction and further comprises nonconductive projections for contacting said contact portions of said contact pins.
4. An adapter according to claim 2, further comprising a stopper member attached to said sliding means for regulating an amount of movement of said sliding means relative to said honeycombed housing.
5. A test adapter according to claim 2 whereby said sliding means is slidably arranged on the upper surface of said honeycomb housing and said test module being mounted on said sliding means.
6. A test adapter for effecting electrical connection between a plurality of conductive pins of a test module and a plurality of test points of a backboard to be tested comprising:
   a printed board;
   a plurality of contact pins each having a contact portion at one end thereof to facilitate electrical contact with said conductive pins and each being inserted so as to protrude through the printed board to facilitate electrical contact with said test points, said contact pins being arranged at positions corresponding to the positions of said conductive pins;
   a honeycombed housing arranged on said printed board and having an upper surface and a plurality of storing holes for respectively storing said contact portions of said contact pins;
   a slidable connector means for simultaneously bringing said conductive pins into contact with said contact portions of said contact pins, respectively, and for mounting said test module, said slidable connector means having pin holes for guiding said conductive pins into said storing holes and being slidably arranged on the upper surface of said honeycombed housing so as to slide in a predetermined linear direction;
   a plurality of projections formed on said slidable connector means and offset from said pin holes in substantially the same predetermined linear direction; and,
   whereby, when said slidable connector means is slid to a first position the projections engage the contact portions of said contact pins and when said slidable connector means is slid to a second position the projections disengage the contact portions and the pin holes are aligned with said contact portions, thereby facilitating simultaneous electrical contact between the plurality of conductive pins and the plurality of test points through said plurality of contact pins.
7. An adapter according to claim 6, further comprising a stopper member, attached to at least one of said honeycombed housing and said slidable connector means, for regulating an amount of movement of said slidable connector means.

* * * * *

UNITED STATES PATENT AND TRADEMARK OFFICE
CERTIFICATE OF CORRECTION

PATENT NO. : 5,386,197
DATED : January 31, 1995
INVENTOR(S) : KOICHI SAITO

It is certified that error appears in the above-identified patent and that said Letters Patent is hereby corrected as shown below:

Column 2, line 4, delete "; plurality of contact pins".

Column 2, line 5, after "includes" insert —plurality of contact pins—.

Signed and Sealed this

Eleventh Day of July, 1995

Attest:

BRUCE LEHMAN

Attesting Officer  Commissioner of Patents and Trademarks